US007787305B2

(12) United States Patent
Kim et al.

(10) Patent No.: US 7,787,305 B2
(45) Date of Patent: Aug. 31, 2010

(54) FLASH MEMORY DEVICES AND PROGRAMMING METHODS THAT VARY PROGRAMMING CONDITIONS IN RESPONSE TO A SELECTED STEP INCREMENT

(75) Inventors: In-Mo Kim, Gyeonggi-do (KR); Jae-Yong Jeong, Gyeonggi-do (KR); Chi-Weon Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 274 days.

(21) Appl. No.: 12/134,648

(22) Filed: Jun. 6, 2008

(65) Prior Publication Data
US 2009/0003075 A1  Jan. 1, 2009

(30) Foreign Application Priority Data
Jun. 28, 2007   (KR) .................... 10-2007-0064551

(51) Int. Cl.
*G11C 16/04* (2006.01)
(52) U.S. Cl. .......................... 365/185.19; 365/185.18; 365/185.23
(58) Field of Classification Search ............ 365/185.19, 365/185.23, 185.18
See application file for complete search history.

(56) References Cited
U.S. PATENT DOCUMENTS
6,469,933 B2   10/2002   Choi et al.

| 7,158,418 | B2 | 1/2007 | Chae et al. |
| 7,239,554 | B2 * | 7/2007 | Jeong ..................... 365/185.28 |
| 7,245,537 | B2 * | 7/2007 | Jeong ..................... 365/185.22 |
| 7,286,413 | B2 * | 10/2007 | Jeong et al. ............ 365/185.28 |
| 7,704,832 | B2 * | 4/2010 | Kai et al. ..................... 438/258 |
| 2002/0060926 | A1 | 5/2002 | Choi et al. |
| 2006/0126399 | A1 | 6/2006 | Cho et al. |

FOREIGN PATENT DOCUMENTS

| JP | 11-110977 A | 4/1999 |
| KR | 2002-0039744 A | 5/2002 |
| KR | 10-2005-0116283 A | 12/2005 |
| KR | 10-2006-0066958 A | 6/2006 |
| KR | 10-2006-0104395 A | 10/2006 |
| WO | WO 2005/043548 A1 | 5/2005 |

* cited by examiner

*Primary Examiner*—Hoai V Ho
*Assistant Examiner*—Fernando N Hidalgo
(74) *Attorney, Agent, or Firm*—Myers Bigel Sibley & Sajovec, P.A.

(57) ABSTRACT

A flash memory device includes a flash memory cell array having flash memory cells arranged with word and bit lines, a word line driver circuit configured to drive the word lines at a selected step increment during a programming operation, a bulk-voltage supply circuit configured to supply a bulk voltage into a bulk of the flash memory cell array and a writing circuit configured to drive the bit lines selected by conditions during a programming operation. A control logic block is configured to control the writing circuit and the bulk-voltage supply circuit during the programming operation. The control logic block is configured to cause the writing circuit and/or the bulk-voltage supply circuit to change at least one of the conditions of the writing circuit and/or the bulk voltage responsive to the selected step increment.

16 Claims, 8 Drawing Sheets

FLASH MEMORY DEVICES AND PROGRAMMING METHODS THAT VARY PROGRAMMING CONDITIONS IN RESPONSE TO A SELECTED STEP INCREMENT

CROSS-REFERENCE TO RELATED APPLICATION

This application claims priority under 35 U.S.C. §119 of Korean Patent Application No. 10-2007-0064551 filed on Jun. 28, 2007, the disclosure of which is hereby incorporated herein by reference in its entirety as if set forth fully herein.

BACKGROUND

The present invention relates to semiconductor memory devices and, more particularly, to flash memory devices and programming methods thereof.

Flash memory devices are widely used in many consumer, commercial and other products. Flash memory devices are electrically erasable and programmable read-only memories (EEPROMs) where a plurality of memory regions are erased or programmed by one programming operation. EEPROMs are widely employed, for example, as subsidiary storage units or system programming tools that are updated periodically because of their functions that enable data to be erased and written electrically. Flash memory devices may be superior to conventional EEPROMs in integration density, which may be highly advantageous for applications for large-capacity subsidiary storage units.

Flash memory devices are generally classified into NOR and NAND types in accordance with the arrangement of the flash memory cells.

A flash memory device generally includes an array of flash memory cells, each of which is formed of, for example, a P-type semiconductor substrate, N-type source and drain regions, a channel region between the source and drain regions, a floating gate for storing charges, and a control gate disposed over the floating gate. The floating gate is interposed between the control gate and the substrate (or bulk). As the floating gate is isolated from the control gate and the bulk, electrons of the floating gate are captured therein to store information. Such control gates of the memory cells are commonly connected to one of a plurality of word lines.

A NOR flash memory device is structured such that one bit line is connected to more than two cell transistors in parallel. In other words, NOR flash memory cells' drain regions sharing the same row are connected in common to one bit line. The NOR flash memory cells are connected between bit lines and source lines. Source regions of the NOR flash memory cells are connected to a common source line. The NOR flash memory cells' control gates sharing the same row are connected in common to one of a plurality of word lines.

A NOR flash memory cell generally stores data by way of a channel hot electron mode. In a programming mode, the source and the substrate of the NOR flash memory cell may be held at the ground voltage. A high voltage (or programming voltage), e.g., about 10V, is applied to the control gate and a voltage (e.g., 5~6V) for inducing hot electrons is applied to the drain of the NOR flash memory cell. The voltages applied to the control gate and the drain act to induce hot electrons. Such hot electrons are accumulated in the floating gate. The accumulated hot electrons charge the floating gate to a negative potential. This programming method acts to raise a threshold voltage of the flash memory cell. Such an electron transfer mechanism is called channel hot electron (CHE) injection.

In erasing the NOR flash memory cell, a large voltage gap is set between the control gate and the substrate (or bulk), which releases electrons from the floating gate through the Fowler-Nordheim (F-N) tunneling effect. Components of the NOR flash memory device are usually divided into erasure segments which are called blocks or sectors. Memory cells of a block or sector are erased at the same time. However, programming the NOR flash memory cells may be carried out in the unit of word or byte.

For the purpose of controlling threshold-voltage distributions of programmed memory cells densely and precisely, an incremental step pulse programming (ISPP) mode is often used. According to the ISPP mode, a programming voltage applied to a word line rises stepwise up along repetition of loops of programming cycle. During this, the programming voltage increases by a predetermined step increment ($\Delta V$), also referred to as a "rising rate". Along the progress of the programming sequence, a cell threshold voltage of a programmed cell increases at a rate predetermined by each programming loop. For that reason, it may be desirable to set the step increment of the programming voltage smaller in order to narrower the latest widths of the threshold-voltage distributions of the programmed cells. As the step increment of the programming voltage is smaller, the number of loops of the programming cycle generally becomes larger. Therefore, the number of programming loops may be arranged to optimize the threshold-voltage distributions without restricting the performance of the flash memory device. Programming of a nonvolatile memory device by means of the ISPP mode is disclosed in U.S. Pat. No. 6,266,270, entitled "Non-Volatile Semiconductor Memory and Programming Method of the Same". Circuits for generating programming voltages by the ISPP mode are disclosed in U.S. Pat. No. 5,642,309, entitled "Auto-Program Circuit In A Nonvolatile Semiconductor Memory Device", and U.S. Pat. No. 6,469,933, entitled "Flash Memory Device Capable of Preventing Program Disturb and Method of Programming the Same".

Each programming loop generally is divided into programming and program-verifying periods. In the programming period, memory cells are programmed under a given bias condition as is well known in this art. In the program-verifying period, the memory cells programmed once are verified whether they are conditioned in the target threshold voltages. The programming loops are repeated for a predetermined number of times until all memory cells are completely programmed. As well known, the program-verifying operation is similar to a reading operation, except that read data is not output to external of the device.

Programming memory cells may be carried out in a convergence mode along with the ISPP mode. According to the convergence mode, a programming voltage applied to a word line stepwise increases with repetition of loops of programming cycle. During this, the programming voltage increases by a predetermined step increment. Generally, the convergence mode is higher than the ISPP mode in step increment of the programming voltage. In the convergence mode, each programming loop includes a programming period and a program-verifying period is included in the last program loop. Thus, according to the convergence mode, the program-verifying operation is once executed in the last programming loop. The convergence mode may be faster than the ISPP mode in programming speed because it need not conduct the verifying operation until the last programming loop.

SUMMARY OF THE INVENTION

Flash memory devices according to some embodiments of the invention include a flash memory cell array having flash memory cells arranged with word and bit lines, a word line driver circuit configured to drive the word lines at a selected step increment during a programming operation, a bulk-voltage supply circuit configured to supply a bulk voltage into a bulk of the flash memory cell array and a writing circuit configured to drive the bit lines selected by conditions during the programming operation. A control logic block is configured to control the writing circuit and the bulk-voltage supply circuit during the programming operation. The control logic block is configured to cause the writing circuit and/or the bulk-voltage supply circuit to change at least one of the conditions of the writing circuit and/or the bulk voltage responsive to the selected step increment.

In some embodiments, the conditions of the writing circuit include a programming time, a bit line voltage, and a number of data bits to be simultaneously programmed.

In some embodiments, the selected step increment of the programming voltage includes a first step increment adopted in a programming period of a convergence programming mode and a second step increment adopted in an incremental step pulse programming (ISPP) mode. The first step increment is larger than the second step increment.

In some embodiments, the control logic block is configured to operate the writing circuit to set the programming time longer when the step increment is set to the first step increment than when the step increment is set to the second step increment.

In some embodiments, the control logic block is configured to operate the writing circuit to set the bit line voltage higher when the step increment is set to the first step increment than when the step increment is set to the second step increment.

In some embodiments, the control logic block is configured to operate the writing circuit to set the number of data bits, which are to be simultaneously programmed, smaller when the step increment is set to the first step increment than when the step increment is set to the second step increment.

In some embodiments, the control logic block is configured to operate the bulk-voltage supply circuit to set the bulk voltage lower when the step increment is set to the first step increment than when the step increment is set to the second step increment.

In some embodiments, the programming operation is conducted in an incremental step pulse programming (ISPP) mode along with a convergence programming mode. The step increment of the programming voltage is selected from a plurality of convergence step increments and selected from a plurality of ISPP step increments, and the control logic block is configured to cause the writing circuit and/or the bulk-voltage supply circuit to change at least one of the conditions of the writing circuit and/or the bulk voltage in accordance with the selected convergence and ISPP step increments.

In some embodiments, the programming operation is conducted in an incremental step pulse programming (ISPP) mode. The step increment of the programming voltage is selected from a plurality of ISPP step increments, and the control logic block is configured to cause the writing circuit and/or the bulk-voltage supply circuit to change at least one of the conditions of the writing circuit and/or the bulk voltage in accordance with the selected ISPP step increment.

In some embodiments, the writing circuit includes a bit-line driver circuit including a driver corresponding to a respective bit line. A bit-line voltage generator is configured to variably generate a bit line voltage, which is supplied to the bit-line driver circuit, by the control logic block in accordance with the step increment of the programming voltage. A cell counting circuit is configured to variably set the number of cells, which are to be programmed, by the control logic block in accordance with the step increment of the programming voltage and controlling the drivers, which correspond to the number of cells to be programmed, to apply the bit line voltage into the bit lines. A programming time controller is configured to variably set a programming time by the control logic block in accordance with the step increment of the programming voltage and activating the drivers for the programming time.

In some embodiments, the bulk-voltage supply circuit includes a bulk voltage generator is configured to variably generate the bulk voltage to be supplied into the bulk of the flash memory cell array by the control logic block in accordance with the step increment of the programming voltage, and a bulk driver is configured to apply the bulk voltage into the bulk of the memory cell array from the bulk voltage generator.

In some embodiments, the flash memory device is a NOR type.

Other embodiments of the present invention provide programming methods for a flash memory device having a plurality of flash memory cells arranged at intersections of plural word and bit lines. These methods include generating a programming voltage at a selected step increment; variably adjusting a bit line voltage, a number of cells to be programmed, a programming time and/or a bulk voltage in response to the selected step increment of the programming voltage; and executing a programming operation with the bit line voltage, the number of cells to be programmed, the programming time and/or the bulk voltage that were variably adjusted in response to the selected step increment of the programming voltage.

In some embodiments, the step increment of the programming voltage includes a first step increment adopted in a programming period of a convergence programming mode and a second step increment adopted in an incremental step pulse programming (ISPP) mode. The first step increment is larger than the second step increment.

In some embodiments, the programming operation is conducted in an incremental step pulse programming (ISPP) mode along with a convergence programming mode. The step increment of the programming voltage is selected from a plurality of convergence step increments and selected from a plurality of ISPP step increments. The bit line voltage, the number of cells to be programmed, the programming time, and/or the bulk voltage are variably controlled in accordance with the selected convergence and ISPP step increments.

In some embodiments, the programming operation is conducted in an incremental step pulse programming (ISPP) mode. The step increment of the programming voltage is selected from a plurality of ISPP step increments. The bit line voltage, the number of cells to be programmed, the programming time, and/or the bulk voltage are variably controlled in accordance with the selected ISPP step increment.

A further understanding of the nature and advantages of the present invention herein may be realized by reference to the remaining portions of the specification and the attached figures.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
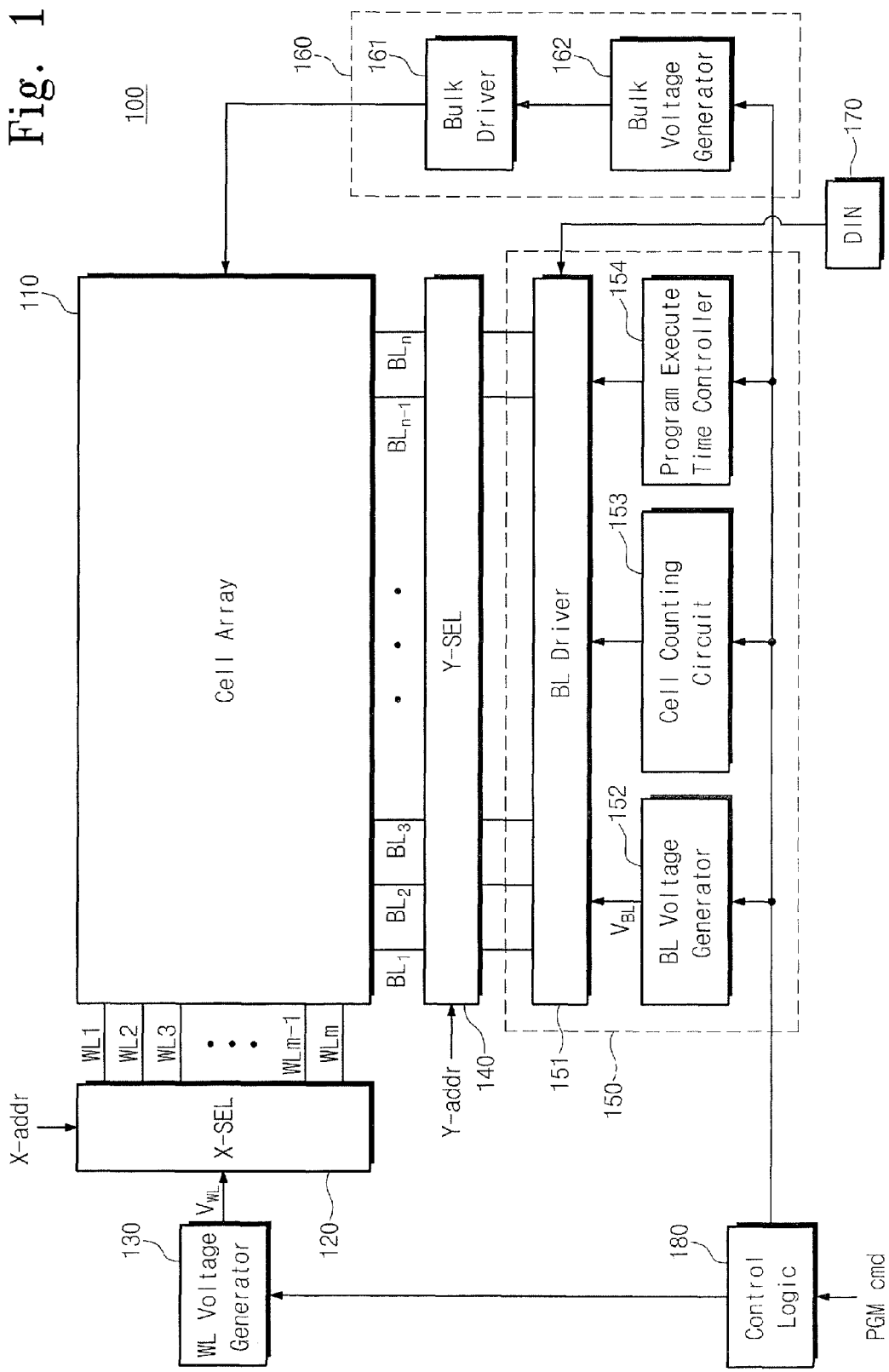
FIG. 1 is a block diagram of a flash memory device according to some embodiments of the present invention.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. Moreover, each embodiment described and illustrated herein includes its complementary conductivity type embodiment as well. Like numbers refer to like elements throughout.

It will be understood that when an element is referred to as being "on," "connected to", "coupled to" or "responsive to" another element (and variants thereof, it can be directly on, connected, coupled or responsive to the other element or intervening elements may be present. In contrast, when an element is referred to as being "directly on," "directly connected to", "directly coupled to" or "directly responsive to" another element (and variants thereof, there are no intervening elements present. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Flash memory devices according to some embodiments of the present invention can variably control a bit line voltage, a number of cells (or data bits) to be programmed, a programming time and/or a bulk voltage. Improved programming performance of a flash memory device may be obtained.

Hereinafter, various embodiments of the present invention will be described in conjunction with the accompanying drawings.

FIG. 1 is a block diagram of a flash memory device according to some embodiments of the present invention. The flash memory device 100 may be a NOR flash memory device as an example.

Referring to FIG. 1, a flash memory device 100 according to various embodiments of the present invention is organized of a flash memory cell array 110, a row selector (X-SEL) 120, a word-line voltage generator 130, a column selector (Y-SEL) 140, a writing circuit 150, a bulk-voltage supply circuit 160, a data input circuit 170, and a control logic block 180.

The flash memory cell array 110 includes a plurality of flash memory cells arranged at intersections of plural rows (i.e., word lines) and columns (i.e., bit lines).

The row selector 120 operates to select one of word lines WL1~WLm in response to row address information, supplying a word line voltage $V_{WL}$ to a selected word line. The word-line voltage generator 130 operates by the control logic block 180, generating the word line voltage $V_{WL}$ to be supplied to a selected word line. A word-line voltage generator 130 according to various embodiments of the present invention is configured to generate the word line voltage $V_{WL}$ (or programming voltage) by the ISPP mode or the convergence mode with the ISPP mode, during a programming operation. In the programming operation, a step increment of the programming voltage by the convergence mode is larger than that by the ISPP mode. The step increments of the programming voltages by the convergence and ISPP modes are variable. As the step increment of the programming voltage becomes smaller, the number of loops of program cycle becomes larger.

The column selector 140 operates to select bit lines BL1~BLn of the memory cell array 110 in a predetermined unit (e.g., ×8, ×16, ×32, or so forth) in response to column address information.

The writing circuit 150 drives a bit line, which is connected to a selected memory cell at a bit line (BL) voltage $V_{BL}$ in accordance with data provided from the data input circuit 170 for programming. The writing circuit 150 is comprised of a bit-line (BL) driver circuit 151, a bit-line (BL) voltage generator 152, a cell counting circuit 153, and a program execute time controller 154. In the programming operation, the BL voltage generator 152 operates to generate and provide the BL voltage $V_{BL}$ to the BL driver circuit 151 by the control logic block 180. The BL voltage VBL is variable by the control logic block 180 in accordance with a step increment $\Delta V$ of the programming voltage.

The cell counting circuit 153, during the programming operation, functions to variably set the number of memory cells (or data bits) to be programmed, according to the step increment $\Delta V$ of the programming voltage, by the control logic block 180. The cell counting circuit 153 controls the BL driver circuit 151 to apply the BL voltage $V_{BL}$ to bit lines, which are as many as the number of set memory cells, among the bit lines designated by the column selector 140.

The program execute time controller 154 operates to variably control a programming time (or programming period) by the control logic block 180 in accordance with the step increment $\Delta V$ of the programming voltage. The program execute time controller 154 activates the BL driver circuit 151 during an adjusted programming period.

The BL driver circuit 151, during the programming operation, temporarily stores data values which are transferred through the data input circuit 170. The BL driver circuit 151 applies the BL voltage $V_{BL}$ to bit lines, which are as many as the number of cells established by the cell counting circuit 153, among the bit lines designated by the column selector 140 in accordance with data values stored therein.

The bulk-voltage supply circuit 160 is comprised of a bulk driver 161 and a bulk voltage generator 162. The bulk voltage generator 162 operates to generate a bulk voltage VB by the control logic block 180 during the programming operation. The bulk voltage VB is variable by the control logic block 190 in accordance with the step increment $\Delta V$ of the programming voltage. The bulk driver 161 applies the bulk voltage VB from the bulk voltage generator 162 to the substrate (or bulk) in which the flash memory cells of the memory cell array 110 are formed.

The control logic block 180 controls an overall function involved in the programming operation of the flash memory device 100. The control logic block 180 controls the programming operation of the flash memory device 100 in response to a programming command PGM_cmd. During the programming operation, the control logic block 180 controls the bit-line voltage generator 152, the cell counting circuit 153, the program execute time controller 154, and/or the bulk voltage generator 162 to variably adjust the BL voltage $V_{BL}$, the number of cells to be programmed, a programming time, and/or the bulk voltage VB in accordance with the step increment $\Delta V$ of the programming voltage.

A flash memory device according to various embodiments of the present invention is able to variably adjust the BL voltage $V_{BL}$, the number of cells to be programmed, a programming time, and/or the bulk voltage VB in accordance with the step increment $\Delta V$ of the programming voltage.

Figure 2:
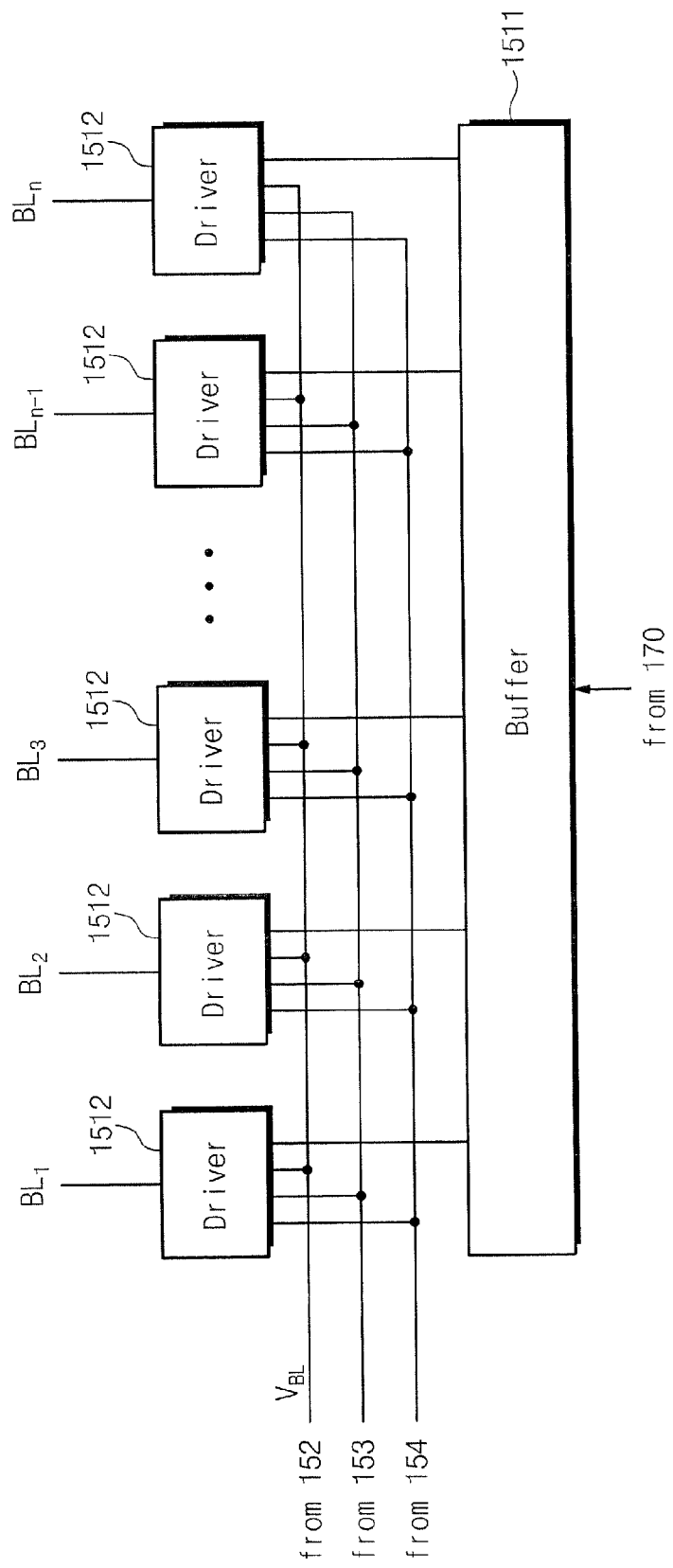
FIG. 2 is a detailed block diagram of a bit-line driver circuit shown in FIG. 1.

FIG. 2 is a detailed block diagram of the BL driver circuit shown in FIG. 1.

Referring to FIG. 2, a BL driver circuit 151 according to some embodiments of the present invention includes a plurality of drivers 1512 corresponding to the bit lines BLn. A buffer 1511 of the BL driver circuit 151 temporarily stores data values transferred through the data input circuit 170 in the programming operation. The drivers 1512 of the BL driver circuit 151 are respectively activated during the programming period by the programming time controller 154 in the programming operation. The drivers 1512 of the BL driver circuit 151 are supplied with the BL voltage $V_{BL}$ from the BL voltage generator 152.

The drivers 1512 of the BL driver circuit 151 apply the BL voltage $V_{BL}$ to bit lines designated by the column selector 140, according to the data values stored therein, or apply the BL voltage $V_{BL}$ to bit lines corresponding to the number of cells which is determined by the cell counting circuit 153 for programming.

When according to the step increment $\Delta V$ of the programming voltage, the cell counting circuit 153 sets the number of cells to be programmed, the BL voltage $V_{BL}$ may be applied to the bit lines as follows:

It is assumed that the bit lines are designated by the column selector 140 in the unit of byte and the number of cells to be programmed is set to four by the cell counting circuit 153 in accordance with the step increment $\Delta V$ of the programming voltage, the cell counting circuit 153 selects four drivers 1512. The four drivers 1512 selected by the cell counting circuit 153 apply the BL voltage $V_{BL}$ to the bit lines corresponding thereto.

Figure 3:
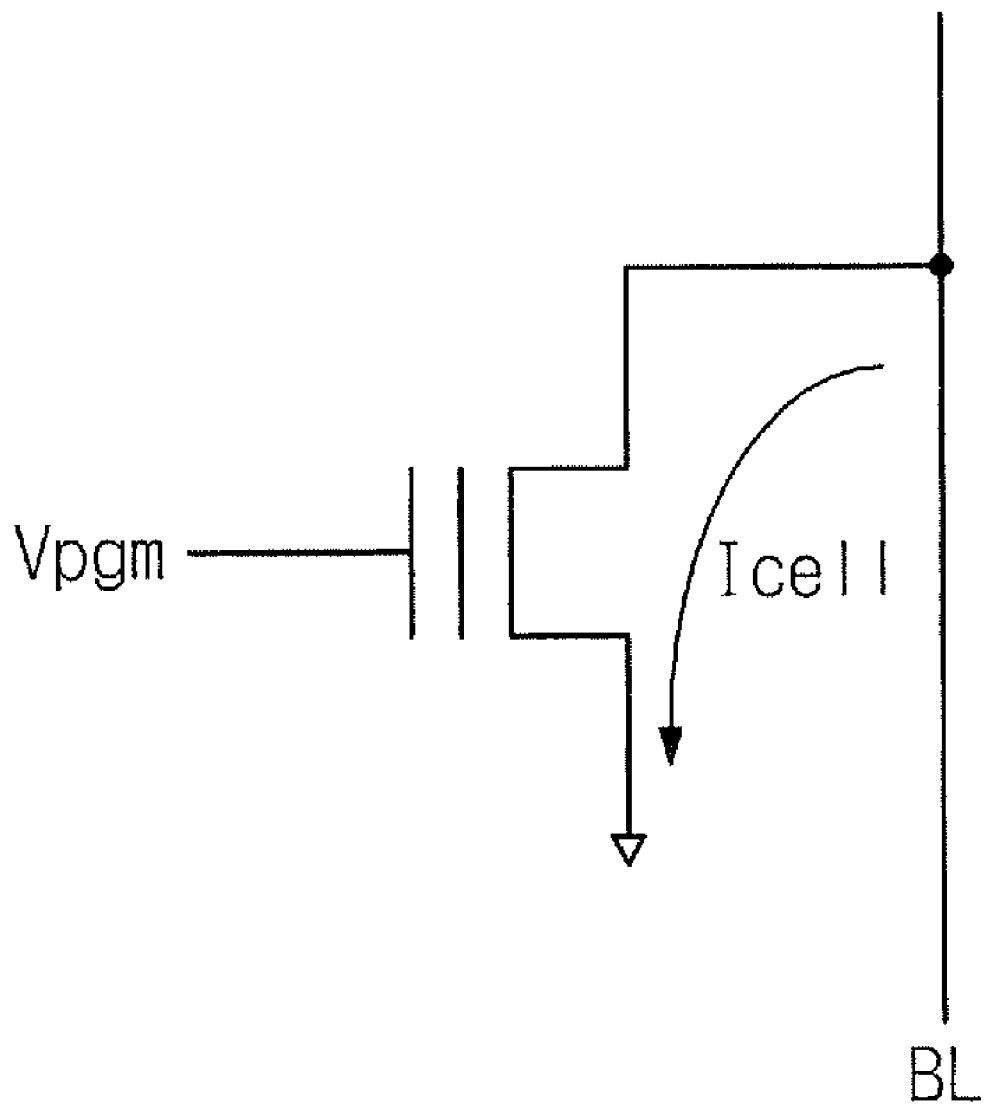
FIG. 3 illustrates a memory cell connected to a bit line of a memory cell array shown in FIG. 1.

FIG. 3 illustrates a memory cell connected to a bit line of the memory cell array shown in FIG. 1.

With reference to FIGS. 1 through 3, a programming operation of the flash memory device now will be described.

In the programming operation, the programming voltage $V_{pgm}$ is applied to the control gate of the flash memory cell, the BL voltage $V_{BL}$ from the BL voltage generator 152 is applied to the drain region, and a voltage (e.g., −1V) lower than 0V is applied to the bulk (or substrate) of the flash memory cell, while programming the flash memory device 100 by means of the ISPP or the convergence scheme. During this, a cell current $I_{cell}$ flowing through a drain-source path of the cell is proportional to $(V_{GS}-V_T)^2$, where $V_T$ is a threshold voltage of the flash memory cell and $V_{GS}$ is a gate-source voltage. Since the gate-source voltage VGS of the flash cell becomes higher as the step increment $\Delta V$ of the programming voltage becomes larger, the cell current $I_{cell}$ also increases.

As the cell current $I_{cell}$ increases and the number of cells to be programmed becomes larger when many bit lines are selected in the programming operation, it increases the total amount of cell currents flowing through programmed flash memory cells. Namely, if the number of cells to be programmed becomes larger, more current abruptly flows through the programmed cells. In this case, since there is a voltage drop at the bit line, the BL voltage $V_{BL}$ applied to the drain region of the flash memory cell may be lowered in level. Because the BL voltage $V_{BL}$ at the drain region of the flash memory cell is not maintained on the normal operative level, the flash memory device 100 may degrade in programming performance.

Therefore, to allow improvement of the programming performance, the control logic block 180 functions to control the BL voltage generator 152, the cell counting circuit 153, the program execute time controller 154, and/or the bulk voltage generator 162 to raise the BL voltage $V_{BL}$, to reduce the number of cells to be programmed, to lengthen the programming time, and/or to lower the bulk voltage VB (i.e., to increase its negative potential).

When the step increment $\Delta V$ of the programming voltage increases, the operations of the BL voltage generator 152, the cell counting circuit 153, the program execute time controller 154, and/or the bulk voltage generator 162, by the control logic block 180, are as follows:

If the step increment $\Delta V$ of the programming voltage increases, the control logic block 180 operates to make the BL voltage generator 152 set a level of the BL voltage $V_{BL}$ higher in preparation for a voltage drop that would be caused by the bit line. The BL voltage VBL is applied to the drivers 1512 of the BL driver circuit 151.

If the step increment $\Delta V$ of the programming voltage increases, the control logic block 180 operates to make the cell counting circuit 153 decrease the number of cells to be programmed so as to reduce the total amount of cell currents flowing though the programmed flash memory cells. In this case, the cell counting circuit 153 selects the drivers 1512 in a predetermined number of cells. The drivers 1512 selected by the predetermined cell number apply the BL voltage VBL into the bit lines from the BL voltage generator 152.

If the step increment $\Delta V$ of the programming voltage increases, the control logic block 180 operates to make the program execute time controller 154 lengthen the programming time in preparation for a voltage drop that would be caused by the bit line. If there is a voltage drop from the bit line, the bit line may need to have a sufficient time to return to its normal voltage level. A longer programming time can provide the bit line with a sufficient time for recovering its normal voltage level even if there is a voltage drop from the bit line. The program execute time controller 154 respectively activates the drivers 1512 of the BL driver circuit 151 during the programming time.

As the bulk voltage $V_B$ becomes lower (i.e., as the negative potential of $V_B$ becomes larger), it enlarges a gap between the programming voltage $V_{pgm}$ and the bulk voltage $V_B$. Thus, as the bulk voltage $V_B$ is deepened in negative level (or negative potential), a threshold voltage $V_T$ of the flash memory cell becomes higher. Since the cell current $I_{cell}$ flowing through the memory cell is proportional to $(V_{GS}-V_T)^2$, the cell current $I_{cell}$ becomes smaller when the threshold voltage $V_T$ raises. As a result, the cell current $I_{cell}$ becomes smaller as low as the bulk voltage $V_B$.

When the step increment $\Delta V$ of the programming voltage increases, as aforementioned, the cell current $I_{cell}$ increases. In this case, the control logic block 180 is able to make the bulk voltage generator 162 generate a small negative level of the bulk voltage $V_B$. The bulk voltage $V_B$ provided from the bulk voltage generator 162 is applied through the bulk driver 161 to the substrate where the memory cells of the memory cell array 110 are formed. As the bulk voltage $V_B$ is lowered, the cell current $I_{cell}$ will be smaller.

A procedure of adjusting the BL voltage $V_{BL}$, the number of cells to be programmed, the programming time, and the bulk voltage $V_B$ when the step increment $\Delta V$ of the programming voltage decreases is the reverse of the aforementioned, so will not be further detailed.

Therefore, it can be understood that during the programming operation, the control logic block 180 operates to make the BL voltage generator 152, the cell counting circuit 153, the program execute time controller 154, and/or the bulk voltage generator 162 raise the BL voltage $V_{BL}$, reduce the number of cells to be programmed, lengthen the programming time, and/or lower the bulk voltage $V_B$, in response to the step increment $\Delta V$ of the programming voltage.

In other words, the flash memory device 100 is operable with selectively variable programming time, BL voltage $V_{BL}$, the number of cells to be programmed, and/or bulk voltage $V_B$, not fixing those values to constants, in response to the step increment $\Delta V$ of the programming voltage. Thereby, the flash memory device 100 can be enhanced in programming performance.

Figure 4:
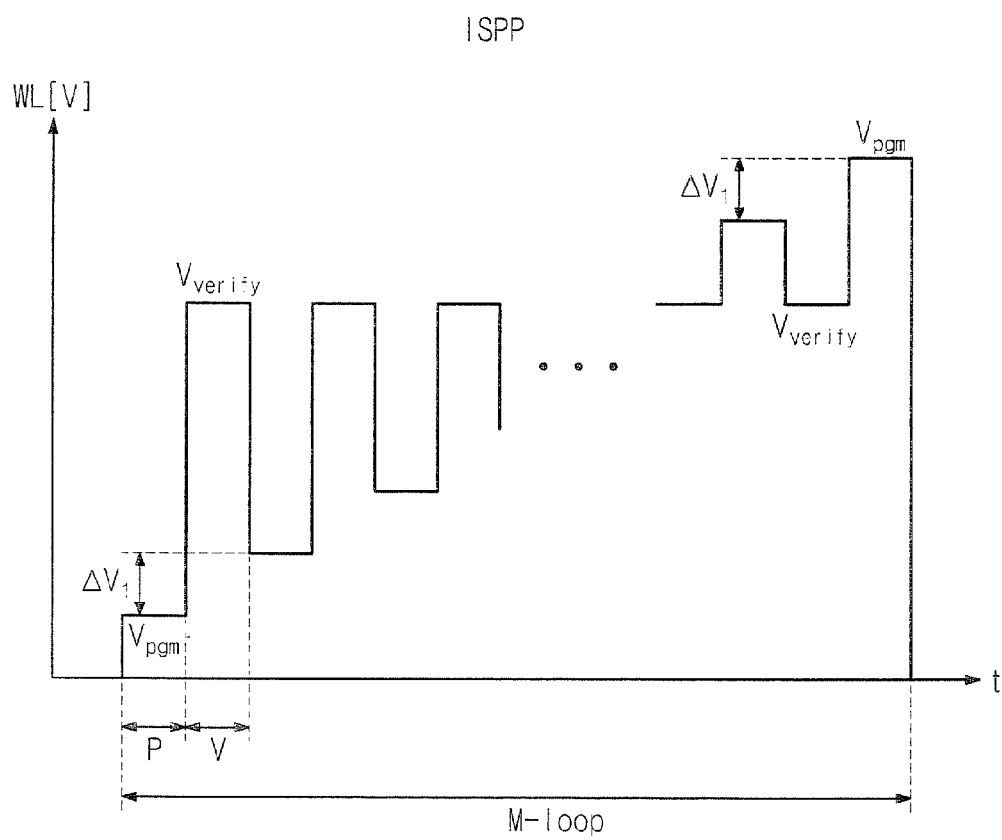
FIGS. 4 and 5 are graphic diagrams showing variations of programming voltages in a flash memory device programmed by an ISPP mode.
Figure 5:
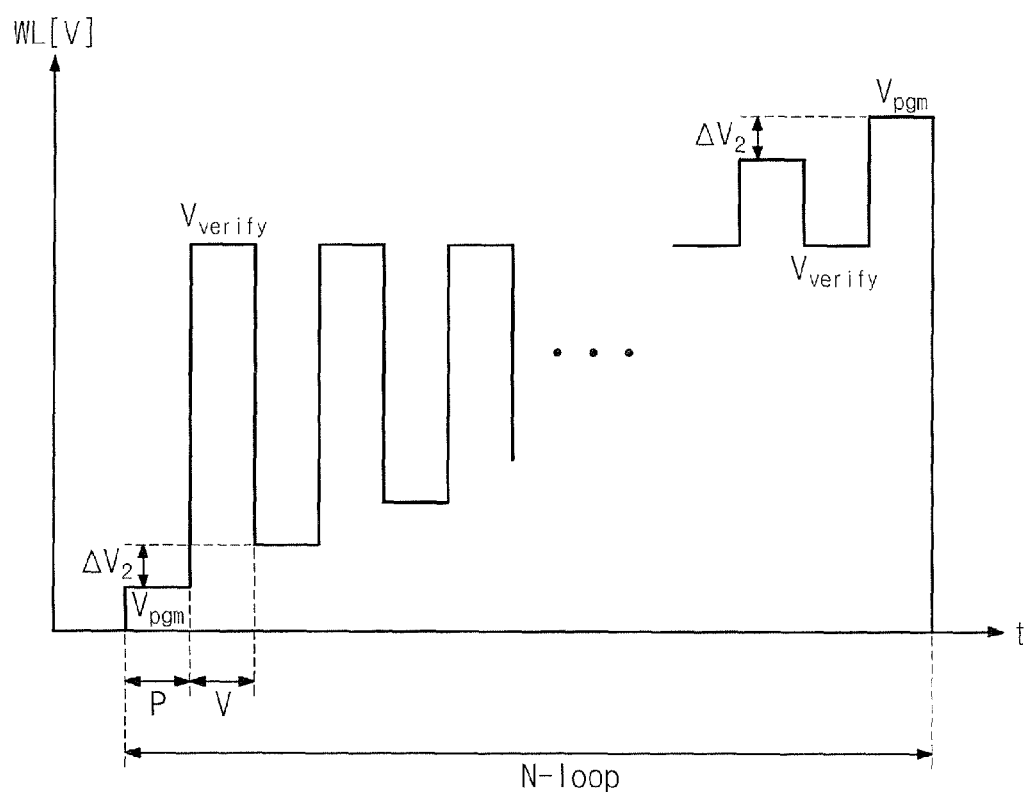

FIGS. 4 and 5 are graphic diagrams showing variations of programming voltages in the flash memory device programmed by the ISPP mode.

Referring to FIGS. 4 and 5, a cycle of programming data that is composed of multiple programming loops (e.g., in number of M or N; M and N are positive integers), each of which is divided into programming (P) and verifying (V) periods. In the programming period, the memory cells are programmed under the given bias condition by way of the well-known method as aforementioned. In the verifying period, the programmed memory cells are verified whether they have been programmed up to their desired threshold voltages.

In the ISPP mode, along the repetition of the programming loops, the programming voltage Vpgm increases by the predetermined step increment $\Delta V_1$ (FIG. 4) or $\Delta V_2$ (FIG. 5) every loop. According to the progress of the programming operation, a threshold voltage of the memory cell being programmed increases by the step increment predetermined in each programming loop. Thus, the step increment of the programming voltage is set smaller in order to result in narrow widths of the threshold-voltage distributions of the programmed cells. As the step increment decreases, the number of the loops of the programming cycle becomes larger.

The step increment $\Delta V_1$ of the programming voltage shown in FIG. 4 is larger than the step increment $\Delta V_2$ shown in FIG. 5. Thus, the number of the programming loops shown in FIG. 4 is smaller than that shown in FIG. 5.

The step increment of the programming voltage may be designed as different from those values of FIGS. 4 and 5. The step increment of the programming voltage by the ISPP mode is called 'ISPP step increment'. The ISPP step increment is selected from a plurality of ISPP step increments.

Figure 6:
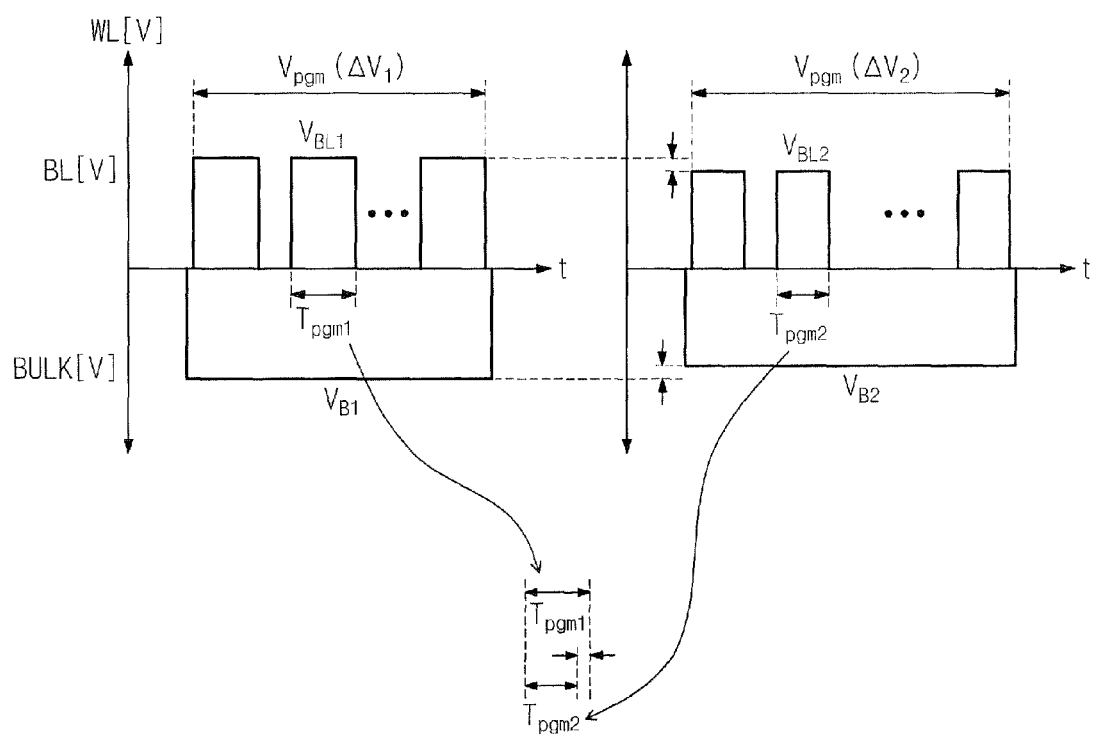
FIG. 6 is a graphic diagram showing patterns of a bit line voltage, a bulk voltage and a programming time which are adjusted by step increments of the programming voltage shown in FIGS. 4 and 5 in accordance with some embodiments of the present invention.

FIG. 6 is a graphic diagram showing patterns of the BL voltage $V_{BL}$, the bulk voltage VB, and the programming time which are adjusted by the step increment of the programming voltage shown in FIGS. 4 and 5 in accordance with some embodiments of the present invention.

In FIG. 6, the BL voltage $V_{BL1}$, the bulk voltage $V_{B1}$, and the programming time $T_{pgm1}$ are obtained from adjustment in accordance with the step increment $\Delta V_1$ of the programming voltage $V_{pgm}$. And, the BL voltage $V_{BL2}$, the bulk voltage $V_{B2}$, and the programming time $T_{pgm2}$ are obtained from adjustment in accordance with the step increment $\Delta V_2$ of the programming voltage $V_{pgm}$.

The step increment $\Delta V_1$ of the programming voltage shown in FIG. 4 is larger than the step increment $\Delta V_2$ of the programming voltage shown in FIG. 5. Thus, referring to the aforementioned programming scheme, the BL voltage $V_{BL1}$ is higher than the BL voltage $V_{BL2}$. Meanwhile, as the bulk voltage $V_B$ is ranged in a negative value, $V_{B1}$ is lower than $V_{B2}$. Further, the programming time $V_{pgm1}$ is longer than the programming time $T_{pgm2}$.

Although not shown in FIG. 6, the number of cells to be programmed, which is set by the step increment $\Delta V_1$ of the programming voltage, is smaller than that set by the step increment $\Delta V_2$ of the programming voltage. The number of memory cells set by the step increment $\Delta V_1$ of the programming voltage are programmed for the programming time $T_{pgm1}$. And, the number of memory cells set by the step increment $\Delta V_2$ of the programming voltage are programmed for the programming time $T_{pgm2}$.

Figure 7:
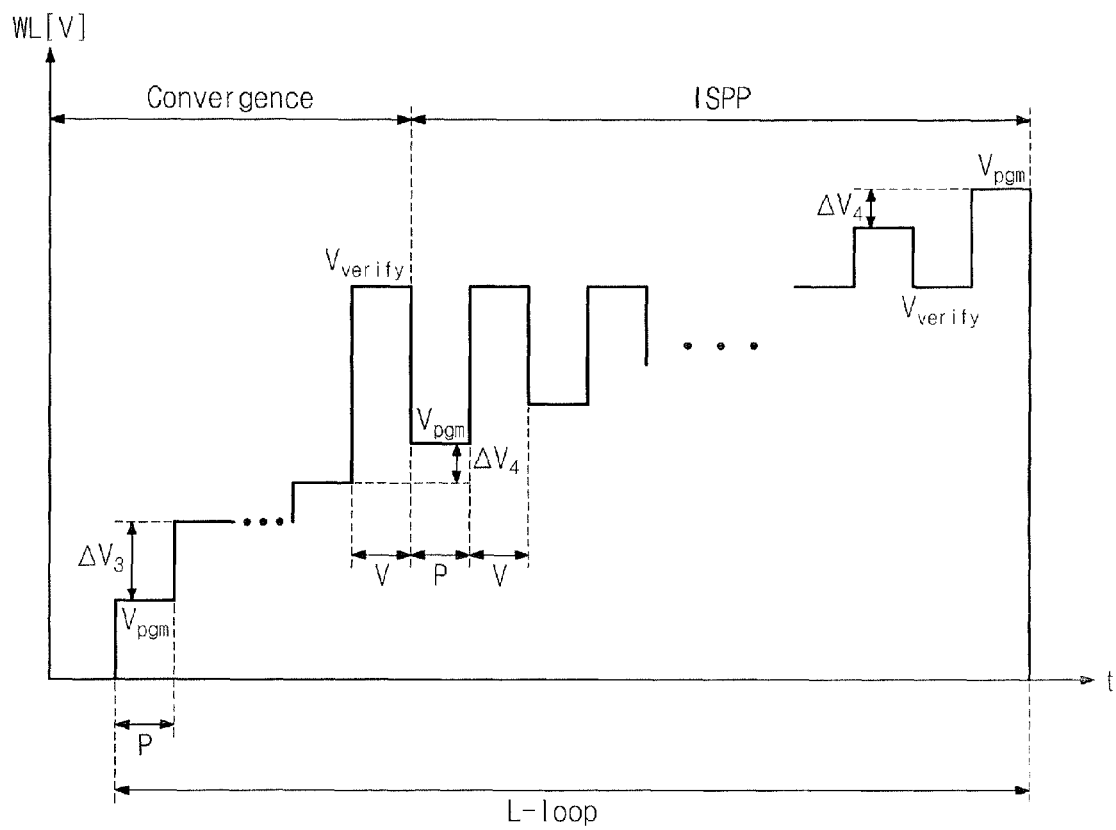
FIG. 7 is a graphic diagram showing variation of the programming voltage in the flash memory device programmed by a convergence mode along with the ISPP mode.

FIG. 7 is a graphic diagram showing variation of the programming voltage in the flash memory device programmed by the convergence mode along with the ISPP mode according to various embodiments of the invention.

Referring to FIG. 7, the programming operation is carried out in the convergence mode along with the ISPP mode. A cycle programming data is composed of plural loops (e.g., in number of L; L is a positive integer). The programming loops (L-loop) include loops by the convergence and ISPP modes.

The programming operation of the flash memory device 100 can be planned according to the ISPP mode, as illustrated in FIG. 7, after preceding a programming step according to the convergence mode. But, this sequence of the programming operation is just an example, which may be designed in reverse.

According to the convergence programming mode, the programming voltage $V_{pgm}$ applied to the word line stepwise increases along the repetition of the loops of the programming cycle. During this, the programming voltage increases up by a step increment $\Delta V_3$ that is predetermined. The step increment $\Delta V_3$ of the programming voltage by the convergence mode is larger than a step increment $V_4$ of the programming voltage by the ISPP mode. Each programming loop by the convergence mode includes a programming period, but a program-verifying period is included only in the last programming loop. In other words, in the convergence programming mode, verifying programmed cells is once executed in the last programming loop. The programming operation by the convergence mode does not conduct the verifying step except in the last programming loop.

Although not shown in FIG. 7, the step increment of the programming voltage by the convergence mode can be changed as like that by the ISPP mode shown in FIGS. 4 and 5. The step increment of the programming voltage by the convergence mode is called 'convergence step increment'. The convergence step increment is selected from a plurality of the convergence step increments.

Referring to FIG. 7, the step increment $\Delta V_3$ of the programming voltage by the convergence mode is larger than the step increment $\Delta V_4$ of the programming voltage by the ISPP mode. Meanwhile, the step increment $\Delta V_4$ of the programming voltage can be set in alteration. The step increments $\Delta V_1$ and $\Delta V_2$ of the programming operation by the ISPP mode are set different from each other as shown in FIGS. 4 and 5. In substance, it can be regarded that the step increment $\Delta V_4$ of the programming voltage contains the step increments $\Delta V_1$ and $\Delta V_2$. The $\Delta V_1$ of the programming voltage is larger than the step increment $\Delta V_2$.

As seen from the aforementioned programming operation, the cell current $I_{cell}$, increases as the step increment of the programming voltage becomes larger. In this case, it goes to raise the BL voltage $V_{BL}$, to decrease the number of cells to be programmed, to lengthen the programming time, and/or to lower the bulk voltage $V_B$. The case that the step increment of the programming voltage becomes smaller is the reverse to the case that the step increment of the programming voltage becoming larger.

As a result, a flash memory device 100 according to various embodiments of the present invention variably adjusts the BL voltage $V_{BL}$, the number of cells to be programmed, the programming time, and/or the bulk voltage $V_B$ in accordance with the step increment $\Delta V$ of the programming voltage. Thereby, the flash memory device 100 can be improved in programming performance.

Figure 8:
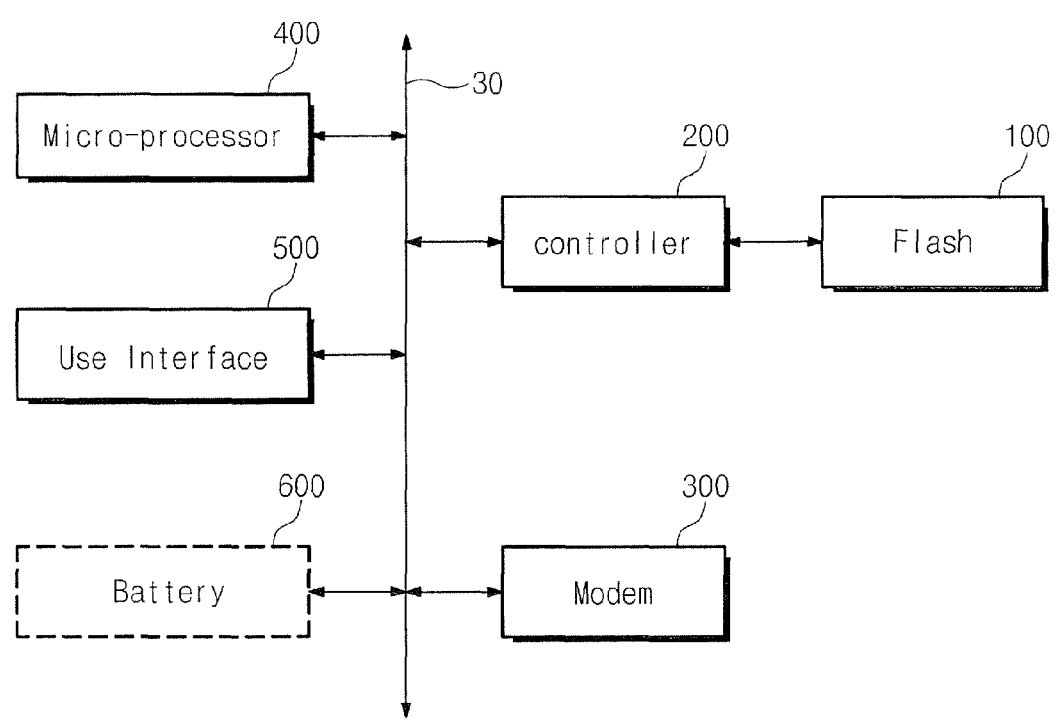
FIG. 8 is a block diagram of a computing system including a flash memory device according to some embodiments the present invention.

FIG. 8 is a block diagram of a computing system including a flash memory device according to various embodiments of the present invention.

Flash memory devices are kinds of nonvolatile memories capable of keeping data stored therein even without power supply. With a rapid increase of commercializing mobile apparatuses such as cellular phones, personal digital assistants (PDA), digital cameras, portable gaming consoles, and MP3 players, the flash memory devices are widely employed, for example, as code storage units, as well as data storage units. The flash memory devices may be also utilized in home applications such as high-definition televisions, digital versatile disks (DVDs), routers, and global positioning systems (GPSs). FIG. 8 shows a schematic computing system including a flash memory device according to various embodiments of the present invention. The computing system includes a microprocessor 400, a user interface 500, a modem 300 such as a baseband chipset, a flash memory controller 200, and a flash memory device 100, all of which are electrically connected to a system bus 30. The flash memory controller 200 and the flash memory device 100 constitute a flash memory system. The flash memory device 100 may be configured as shown in FIG. 1. In the flash memory device 100, N-bit data (N is a positive integer) to be processed by the microprocessor 400 are stored through the flash memory controller 200. If the computing system shown in FIG. 8 is a mobile apparatus, it is further comprised of a battery 600 for supplying power thereto. Although not shown in FIG. 8, the computing system of FIG. 8 may be further equipped with an application chipset, a camera image processor (e.g., CMOS image sensor; CIS), a mobile DRAM, etc.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A flash memory device comprising:
   a flash memory cell array having flash memory cells arranged with word and bit lines;
   a word line driver circuit configured to drive the word lines at a selected step increment during a programming operation;
   a bulk-voltage supply circuit configured to supply a bulk voltage into a bulk of the flash memory cell array;
   a writing circuit configured to drive the bit lines selected by conditions in a programming operation; and
   a control logic block configured to control the writing circuit and the bulk-voltage supply circuit during the programming operation,
   wherein the control logic block is configured to cause the writing circuit and/or the bulk-voltage supply circuit to change at least one of the conditions of the writing circuit and/or the bulk voltage in response to the selected step increment,
   wherein the selected step increment of the programming voltage includes a first step increment adopted in a programming period of a convergence programming mode and a second step increment adopted in an incremental step pulse programming (ISPP) mode,
   wherein the first step increment is larger than the second step increment.

2. The flash memory device as set forth in claim 1, wherein the conditions of the writing circuit include a programming time, a bit line voltage, and a number of data bits to be simultaneously programmed.

3. The flash memory device as set forth in claim 1, wherein the control logic block operates the writing circuit to set the programming time longer when the step increment is set to the first step increment than when the step increment is set to the second step increment.

4. The flash memory device as set forth in claim 1, wherein the control logic block is configured to operate the writing circuit to set the bit line voltage higher when the step increment is set to the first step increment than when the step increment is set to the second step increment.

5. The flash memory device as set forth in claim 1, wherein the control logic block is configured to operate the writing circuit to set the number of data bits, which are to be simultaneously programmed, smaller when the step increment is set to the first step increment than when the step increment is set to the second step increment.

6. The flash memory device as set forth in claim 1, wherein the control logic block is configured to operate the bulk-voltage supply circuit to set the bulk voltage lower when the step increment is set to the first step increment than when the step increment is set to the second step increment.

7. The flash memory device as set forth in claim 2, wherein the programming operation is conducted in an incremental step pulse programming (ISPP) mode along with a convergence programming mode, wherein the step increment of the programming voltage is selected from a plurality of convergence step increments and selected from a plurality of ISPP step increments, and the control logic block is configured to cause the writing circuit and/or the bulk-voltage supply circuit to change at least one of the conditions of the writing circuit and/or the bulk voltage in accordance with the selected convergence and ISPP step increments.

8. The flash memory device as set forth in claim 2, wherein the programming operation is conducted in an incremental step pulse programming (ISPP) mode, wherein the step increment of the programming voltage is selected from a plurality of ISPP step increments, and the control logic block is configured to cause the writing circuit and/or the bulk-voltage supply circuit to change at least one of the conditions of the writing circuit and/or the bulk voltage in accordance with the selected ISPP step increment.

9. The flash memory device as set forth in claim 1, wherein the writing circuit comprises:

a bit-line driver circuit including a driver corresponding to a respective bit line;

a bit-line voltage generator configured to variably generate a bit line voltage, which is supplied into the bit-line driver circuit by the control logic block in accordance with the step increment of the programming voltage;

a cell counting circuit configured to variably set the number of cells, which are to be programmed, by the control logic block in accordance with the step increment of the programming voltage and controlling the drivers, which correspond to the number of cells to be programmed, to apply the bit line voltage to the bit lines; and a program execute time controller configured to variably set a programming time by the control logic block in accordance with the step increment of the programming voltage and activating the drivers for the programming time.

10. The flash memory device as set forth in claim 1, wherein the bulk-voltage supply circuit comprises:

a bulk voltage generator configured to variably generate the bulk voltage to be supplied into the bulk of the flash memory cell array by the control logic block in accordance with the step increment of the programming voltage; and a bulk driver configured to apply the bulk voltage into the bulk of the flash memory cell array from the bulk voltage generator.

11. The flash memory device as set forth in claim 1, wherein the flash memory cell array is arranged as a NOR flash memory array.

12. The flash memory device of claim 1 in combination with a memory controller configured to control the flash memory device, to provide a flash memory system.

13. The flash memory device of claim 1 in combination with a microprocessor and a memory controller configured to control the flash memory device by request of the microprocessor, to provide a computing system.

14. A programming method for a flash memory device having a plurality of flash memory cells arranged at intersections of plural word and bit lines, the method comprising:

generating a programming voltage at a selected step increment;

variably adjusting a bit line voltage, a number of cells to be programmed, a programming time and/or a bulk voltage in response to the selected step increment of the programming voltage; and executing a programming operation with the bit line voltage, the number of cells to be programmed, the programming time and/or the bulk voltage that were variably adjusted in response to the selected step increment of the programming voltage, wherein the step increment of the programming voltage includes a first step increment adopted in a programming period of a convergence programming mode and a second step increment adopted in an incremental step pulse programming (ISPP) mode, wherein the first step increment is larger than the second step increment.

15. The programming method as set forth in claim 14, wherein the programming operation is conducted in an incremental step pulse programming (ISPP) mode along with a convergence programming mode, wherein the step increment of the programming voltage is selected from a plurality of convergence step increments and selected from a plurality of ISPP step increments, and wherein the bit line voltage, the number of cells to be programmed, the programming time, and/or the bulk voltage are variably controlled in accordance with the selected convergence and ISPP step increments.

16. The programming method as set forth in claim 14, wherein the programming operation is conducted in an incremental step pulse programming (ISPP) mode, wherein the step increment of the programming voltage is selected from a plurality of ISPP step increments, and wherein the bit line voltage, the number of cells to be programmed, the programming time, and/or the bulk voltage are variably controlled in accordance with the selected ISPP step increment.

* * * * *